(12) United States Patent
Luo et al.

(10) Patent No.: US 9,698,763 B1
(45) Date of Patent: Jul. 4, 2017

(54) ULTRA LOW VOLTAGE RING OSCILLATOR WITH REDUNDANT INVERTER

(71) Applicant: GLOBALFOUNDRIES Singapore Pte. Ltd., Singapore (SG)

(72) Inventors: Zhihong Luo, Singapore (SG); Benjamin Shui Chor Lau, Singapore (SG); Chun Huat Heng, Singapore (SG); Yong Lian, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/985,457

(22) Filed: Dec. 31, 2015

(51) Int. Cl.
*H03K 3/03* (2006.01)
*H03K 5/133* (2014.01)

(52) U.S. Cl.
CPC .......... *H03K 3/0315* (2013.01); *H03K 5/133* (2013.01)

(58) Field of Classification Search
CPC ............................. H03K 5/133; H03K 3/0315
USPC ..................................... 331/57; 327/261, 291
See application file for complete search history.

(56) References Cited

U.S. PATENT DOCUMENTS 7,102,449 B1 * 9/2006 Mohan ................. H03K 3/0322
327/57

* cited by examiner

*Primary Examiner* — Arnold Kinkead
(74) *Attorney, Agent, or Firm* — Horizon IP Pte. Ltd.

(57) ABSTRACT

Redundant inverters with multiple inverter stages enable lower operating voltages to be used. For example, the use of multiple inverter stages produces a strong "0" or a strong "1" output signal. The strong output signal facilitates self-oscillation of a ring oscillator at lower voltages.

20 Claims, 7 Drawing Sheets

ULTRA LOW VOLTAGE RING OSCILLATOR WITH REDUNDANT INVERTER

BACKGROUND

Supply voltage is generally very low in energy harvesting applications. As such, a self-starter circuit is required to trigger a semiconductor chip which includes power management circuit to start operate in such a low supply voltage. A ring oscillator is typically used as the self-starter circuit. However, a conventional ring oscillator requires relatively high self-oscillating voltage which is undesirable.

From the foregoing discussion, it is desirable to provide a ring oscillator circuit which can operate at ultra-low supply voltages, such as 45-50 mV or below.

SUMMARY

Embodiments of the present disclosure generally relate to redundant inverters in semiconductor devices. In one aspect, a redundant inverter includes a redundant inverter input terminal for receiving an inverter input signal; and a redundant inverter output terminal for generating an inverter output signal. The redundant inverter also includes an input module with a high section and a low section. The high section includes a first inverter having a first p-type transistor and a first n-type transistor coupled in series between a high power source and a low power source, the first inverter includes a first inverter input terminal coupled to the redundant inverter input terminal and a first inverter output terminal. The low section includes a second inverter with a second p-type transistor and a second n-type transistor coupled in series between the high and low power sources. The second inverter includes a second inverter input terminal coupled to the redundant inverter input terminal and the second inverter output terminal. The redundant inverter further includes an output module with an output inverter. The output inverter includes an output p-type transistor and an output n-type transistor coupled in series between the first inverter output terminal and the second inverter output terminal, a first output inverter terminal coupled to the redundant inverter output terminal, and a second output inverter terminal coupled to the redundant inverter input terminal. The input module with the first and second inverters and the output module with the output inverter form a two stage redundant inverter.

In another aspect, a redundant inverter includes a redundant inverter input terminal for receiving an inverter input signal; and a redundant inverter output terminal for generating an inverter output signal. The redundant inverter also includes an input module with inverters arranged into a high section and a low section. The high section generates a high section output signal at a high section output terminal. The low section generates a low section output signal at a low section output terminal. In response to a logic 1 input signal at the redundant inverter input terminal, the high section is configured to generate a weak "0" at the high section output terminal, and the low section is configured to generate a strong "0" at the low section output terminal. In response to a logic 0 input signal at the redundant inverter input terminal, the high section is configured to generate a strong "1" at the high output terminal, and the low section is configured to generate a weak "1" at the low section output terminal. The redundant inverter further includes an output module with an output inverter. The output inverter includes an output inverter high power source terminal coupled to the high section output terminal, an output inverter low power source terminal coupled to the low section output terminal, an output inverter input terminal coupled to the redundant inverter input terminal, and an output inverter output terminal coupled to the redundant inverter output terminal.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

DETAILED DESCRIPTION

Embodiments of the present disclosure generally relate to semiconductor devices, such as integrated circuit (ICs). The ICs may be any type of ICs. The ICs include redundant inverters. A redundant inverter includes multiple stages of inverters. The redundant inverter can operate in low voltage regimes, such as ultra-low voltage regimes. For example, the inverters can operate with a supply voltage at about 50 mV or below. For example, the inverters can operate at 45-50 mV or below. Operating at other suitable voltages may also be useful. In general, lower operating voltages may be achieved with additional inverter stages. The desired operating voltage may be achieved with the appropriate amount of inverter stages.

Figure 1A:
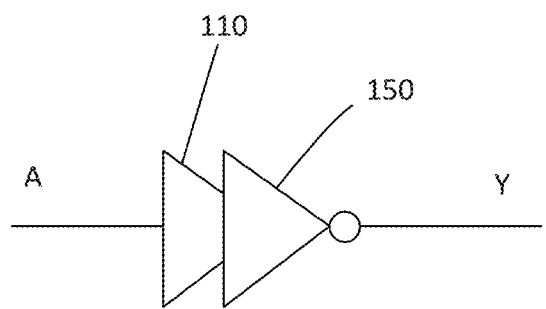
FIG. 1a shows a circuit symbol of an embodiment of a redundant inverter.

FIG. 1a shows a circuit symbol of an embodiment of a redundant inverter 100. As shown, the redundant inverter includes a double triangle, representing input and output modules 110 and 150. An input terminal A is coupled to the input module and an output terminal Y is coupled to the output module. The output signal at output terminal Y is the inverted input signal at input terminal A.

Figure 1B:
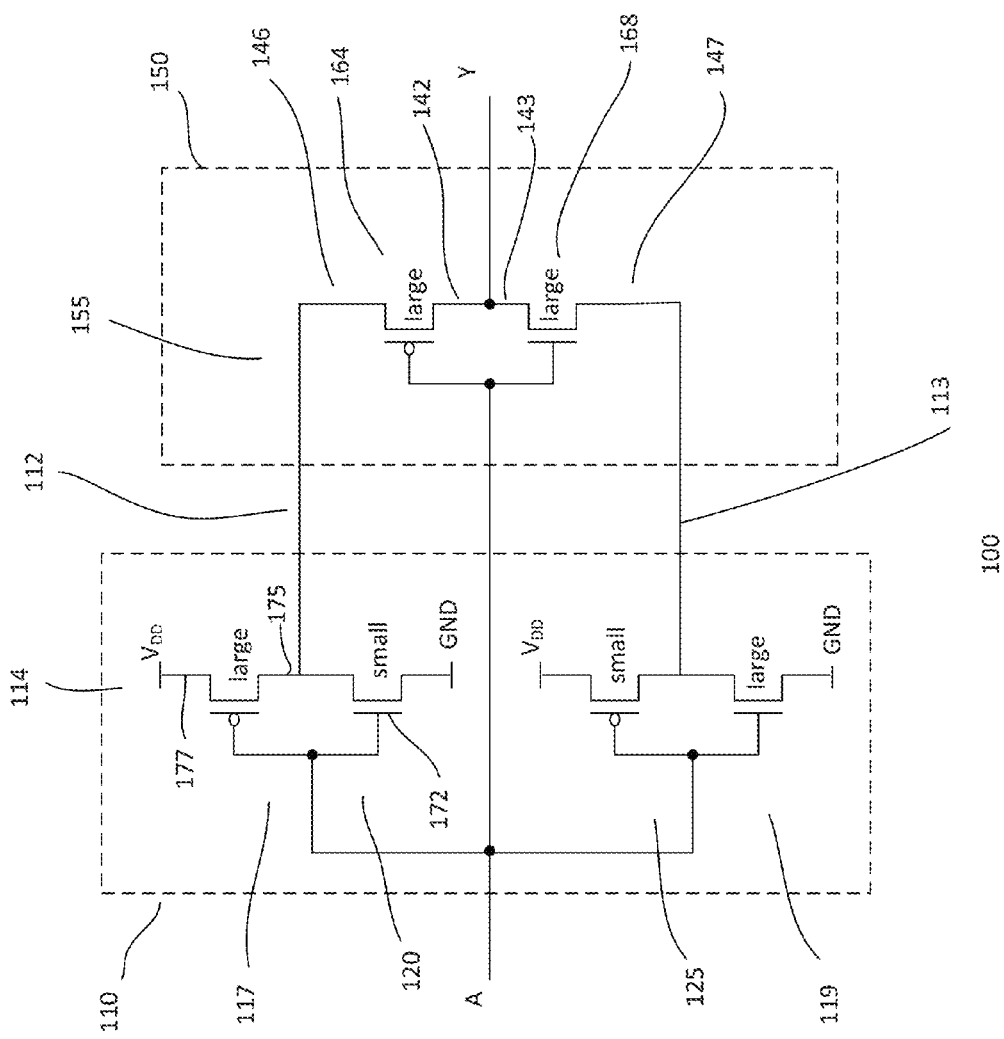
FIG. 1b shows a schematic diagram of an embodiment of the redundant inverter.

FIG. 1b shows a schematic diagram of an embodiment of a redundant inverter 100. The redundant inverter includes transistors. In one embodiment, the transistors are metal oxide semiconductor field effect transistors (MOSFETs). Other types of transistors may also be useful.

A MOSFET is formed on a semiconductor substrate, such as a silicon substrate. Other types of substrates may also be useful. The transistor is disposed in a device region defined by isolation regions, such as shallow trench isolation regions. Other types of isolation regions may also be useful. The device region includes a second polarity type doped well which serves as a body of a first polarity type transistor. For example, a p-type doped well serves as a body of an n-type transistor (nFET) while an n-type doped well serves as a body of a p-type transistor (pFET). The device well is a lightly or intermediately doped well.

A gate of the transistor is disposed on the substrate between first and second source/drain (S/D) regions and in the substrate. The gate, for example, includes a gate electrode over a gate dielectric. The gate electrode may be formed of polysilicon while the gate dielectric may be formed of silicon oxide. Other types of gate electrode and gate dielectric materials may also be useful. The S/D regions are heavily doped regions with first polarity type dopants. For example, n-type doped S/D regions are used for n-type transistors and p-type doped S/D regions are used for p-type transistors. The gate and S/D terminals serve as transistor terminals. For example, the gate serves as a gate terminal 172 and the first and second S/D regions serve as first and second terminals 175 and 177.

As shown, the redundant inverter includes an input module 110 and an output module 150. In one embodiment, the input and output modules are signal stage modules. For example, the input and output modules form a 2-stage redundant inverter.

The input stage provides output signals to the output module. In one embodiment, the output signals include first and second power sources or rail signals for the output module. For example, the output signals are high (first) and low (second) power sources for the output inverter of the output module.

The output stage includes an output inverter 155 having first and second output transistors 164 and 168 coupled in series. The first output transistor is a p-type transistor and the second output transistor is an n-type transistor. For example, the first output transistor is a pFET and the second output transistor is an nFET. The first terminals 142 and 143 of the output transistors form a common inverter output terminal Y, and the second terminals 146 and 147 of the output transistors serve as input terminals of the output module from the input module, and the gate terminals are coupled to the inverter input terminal A.

In one embodiment, the inverter of the output stage is a balanced inverter. For example, the size of the first and second output transistors is the same. For example, the output transistors are balanced. In a preferred embodiment, the first and second output transistors are large MOSFETs. The use of large transistors are preferred to generate a higher current for the output signal. This, for example, can improve performance. The use of other sized output transistors may also be useful. For example, other balanced transistor configurations may also be useful for the output inverter.

The size of a transistor is relative and may be determined by the W/L, which is the width and length of the channel. The length L is generally fixed according to the technology node. The width W may be adjusted to determine the size of the transistor. For example, the L of a transistor for a 65 nm technology node may be about 60 nm. The W/L of a large pFET may be about 4 µm/60 nm, a large nFET may be about 4.8 µm/60 nm, a small pFET may be about 0.5 m/60 nm, a small nFET may be about 0.6 µm/60 nm while an intermediate pFET may be about 1.5 µm/60 nm and an intermediate nFET may be about 1.8 µm/60 nm. Other dimensions may also be used to reflect the relative size of large, intermediate or small transistors.

As for the input module, it includes input inverters. Inverters of the input module are similar to the output inverter. For example, an input inverter includes first and second transistors coupled in series. The first transistor is a p-type while the second transistor is an n-type. Common first terminals form an output of the input inverter while gates form a common input terminal of the input inverter coupled to the redundant inverter input terminal A. As for the second terminals of the input transistors, they serve as input terminals for high and low power sources.

The input inverters generate first and second input module (IM) output signals at IM output terminals 112 and 113. The input module is separated into first and second sections 117 and 119. The first section generates the first IM output signal at the first IM output terminal and the second section generates the second IM output signal at the second IM output terminal. The first IM output terminal 112 is coupled to the second terminal 146 of the first output transistor 164 of the output inverter and the second IM output terminal 113 is coupled to the second terminal 147 of the second output transistor 168 of the output inverter.

In one embodiment, the first section 117 is configured to produce a strong logic 1 (high) signal or a weak logic 0 (low) signal at the first IM output terminal 112 and the second section 119 is configured to produce a weak logic 1 signal or a strong logic 0 signal at the second IM output terminal 113. The strong or weak logic signals are based on the redundant inverter input signal at the redundant inverter input terminal A. In one embodiment, when the inverter input signal is a logic 0 signal, the first section generates a strong logic 1 or "1" signal while the second section generates a weak logic 1 signal. On the other hand, when the inverter input signal is a logic 1 signal, the first section generates a weak logic 0 or "0" signal while the second section generates a strong logic 0 signal.

A strong "1" refers to a logic 1 signal which is close to the supply voltage $V_{Supply}$ (not shown). The supply voltage is the voltage provided at the high power source of the output inverter. The supply voltage, for example, is the first IM output signal of the input module. On the other hand, a weak "1" refers to a logic 1 signal which is greater than $0.5*V_{Supply}$ (not shown) but not close to $V_{Supply}$ as a strong "1" is. A strong "0" refers to a logic 0 signal close to ground while a weak "0" refers to a logic 0 signal which is lower than $0.5*V_{Supply}$ but not close to ground as a strong "0" is. The ground, for example, is the voltage provided in FIG. 1$b$ labeled as GND.

As discussed, the output signals of the input module serve as power sources for the output inverter. For example, the first IM output signal serves as a high power source and the second IM output signal serves as a low power source of the output inverter. As discussed, the inverter input signal is coupled to the gate terminals of the output transistors. This results in the output module generating a strong logic 1 signal at the redundant inverter output terminal Y for a logic 0 input signal at input terminal A. This is because the pFET 164 has a smaller resistance than the nFET 168 when input A is a logic 0 signal. As such, the output Y will be more close to the voltage of 146 which is a strong "1". On the other hand, the output Y is a strong "0" for a logic 1 input signal at input terminal A. This is because nFET 168 has a smaller resistance than pFET 164 when input A is a logic 1 signal. As such, the output Y will be more close to the voltage of 147 which is a strong "0".

The input module, as discussed, includes a single input stage 114. As shown, the input stage includes a first input inverter 120 for the first section 117 and a second input inverter 125 for the second section 119. In one embodiment, the first inverter is coupled to high and low power sources, such as $V_{DD}$ and GND. For example, a first or p-type transistor has its second terminal coupled to $V_{DD}$ and a second or n-type transistor has its second terminal coupled to GND. The output terminal 112 formed by common first terminals of the input transistors of the first input inverter is coupled to the second terminal of the first output transistor. Similarly, the second terminals of the first (p-type) transistor and second (n-type transistor) are coupled to $V_{DD}$ and $G_{ND}$ while the output terminal 113 formed by common first terminals of the input transistors of the second input inverter is coupled to the second terminal of the second output transistor.

In one embodiment, the first inverter is configured to produce a strong "1" or a weak "0", depending on whether the input at terminal A is a logic 0 or logic 1 signal. To produce a strong logic 1 signal or a weak logic 0 signal, the first inverter in the first section is imbalanced. In one embodiment, the first input inverter includes a large p-type transistor and a small n-type transistor. As discussed, the first input inverter serves as the high power source for the output inverter. The large p-type transistor, which is coupled to the high power source, such as $V_{DD}$, facilitates in generating a strong logic 1 when the input at terminal A is a logic 0. The small n-type transistor, which is coupled to the low power source, such as GND, facilitates in producing a weak logic 0 signal when the input at terminal A is a logic 1.

As for the second inverter, it is also imbalanced. However, it is imbalanced in the opposite direction as the first inverter. For example, the second inverter includes a small p-type transistor and a large n-type transistor. The large n-type transistor, which is coupled to the low power source, such as GND, facilitates in generating a strong "0" when the input at terminal A is a logic 1. The small p-type transistor, which is coupled to the high power source, such as $V_{DD}$, facilitates in producing a weak "1" signal when the input at terminal A is a logic 0.

When input A is a logic 1 signal, the nFET 168 of the output inverter has a much smaller resistance than the pFET 164 of the output inverter. As such, the output signal Y will be very close to the second IM output signal 113, which is a strong "0". On the other hand, when input A is a logic 0 signal, the nFET 168 has a much larger resistance than the pFET 164, resulting in the output Y's voltage to be very close to the strong "1" of the first IM output signal 112.

Providing a 2-stage redundant inverter (1 input stage and 1 output stage) produces a stronger logic 1 or a stronger logic 0 signal at the redundant inverter terminal Y compared to conventional inverters. The stronger logic 0 and 1 signals enable the inverter to operate with low supply voltages, such as less than 45-50 mV. However, the additional stage is at the cost of operating speed and larger inverter size or footprint.

Figure 2:
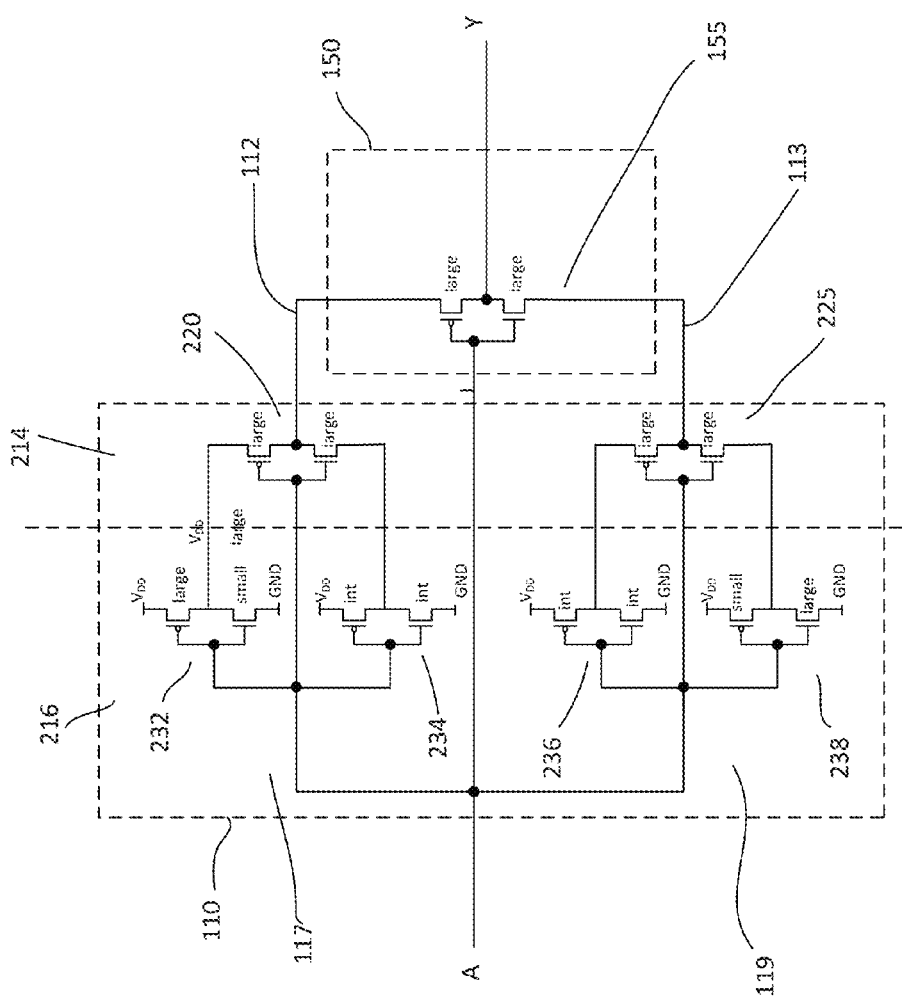
FIG. 2 shows a schematic diagram of another embodiment of the redundant inverter.

FIG. 2 shows another embodiment of a redundant inverter 200. The redundant inverter includes common elements as that described in FIGS. 1a-1b. Common elements may not be described or described in detail.

As shown, the redundant inverter includes input and output modules 110 and 150. The output module, in one embodiment, includes an output inverter 155 having a first p-type transistor and a second n-type transistor. The first terminals of the output transistors form a common terminal, serving as the redundant inverter output terminal Y. The output transistors are balanced transistors. For example, the transistors are large transistors. The gate terminals of the output transistors are commonly coupled to the redundant inverter input terminal A. The second terminals of the first and second output transistors are coupled to first and second IM output terminals 112 and 113.

The input module includes first and second input stages 214 and 216. The input module includes first and second sections 117 and 119. The first section is configured to produce a strong logic 1 (high) signal or a weak logic 0 (low) signal at the first IM output terminal 112 and the second section is configured to produce a weak logic 1 signal or a strong logic 0 signal at the second IM output terminal 113. The strong or weak logic signals are based on the redundant inverter input signal at the redundant inverter input terminal A. In one embodiment, when the inverter input signal is a logic 0, the first section 117 generates a strong logic 1 signal while the second section 119 generates a weak logic 1 signal. On the other hand, when the inverter input signal is a logic 1 signal, the first section 117 generates a weak logic 0 signal while the second section 119 generates a strong logic 0 signal.

The first input stage 214 includes first and second input inverters 220 and 225. For example, the first and second input inverters are part of the first input stage of the input module. The first inverter is part of the first or high inverter section and the second inverter is part of the second or low inverter section. The common first terminals of the transistors of the first input inverter form the first IM output terminal 112 which serves as the high power source for the output inverter. As for the second input inverter, the common first terminals of the transistors form the second IM output terminal 113 which serves as the low power source for the output inverter. The gate terminals of the transistors of the first and second input inverters are commonly coupled to the inverter input terminal A.

The second input stage 216 includes third, fourth, fifth and sixth input inverters 232, 234, 236 and 238. For example, the third, fourth, fifth and sixth input inverters are part of the second input stage of the input module. The third and fourth input inverters are part of the high inverter section and the fifth and sixth input inverters are part of the low inverter section. The inverters of the second input stage are each coupled between the high power source, such as $V_{DD}$ and the low power source, such as GND.

The second input inverters serve as power sources for the first stage inverters. For example, the third input inverter's output serves as the high power source for the first input inverter and the fourth input inverter's output serves as the low power source for the first input inverter. Similarly, the fifth input inverter's output serves as the high power source for the second input inverter and the sixth input inverter's output serves as the low power source for the second input inverter. The gate terminals of the transistors of the second stage input inverters are commonly coupled to the inverter input terminal A.

As for the first or high section, the third inverter 232 of the second input stage 216 which provides the high power source for the first input inverter 220 of the first input stage 214 is an imbalanced inverter. In one embodiment, the p-type transistor is a large transistor while the n-type transistor is a small transistor. The fourth inverter 234, which provides the low power source for the first input inverter, is a balanced inverter. Preferably, the transistors of the fourth inverter are intermediate sized transistors. The inverters of first input stage of the high section are balanced inverters, having both p-type and n-type as large transistors. Providing other sized or configurations of transistors for the inverters may also be useful.

As for the second or low section, the fifth inverter 236, which provides the high power source for the second input inverter 225, is a balanced inverter. Preferably, the transistors of the fifth inverter are intermediate sized transistors. The sixth inverter 238, which provides the low power source for the second input inverter 225 of the first input stage 214, is an imbalanced inverter. In one embodiment, the p-type transistor is a small transistor while the n-type transistor is a large transistor. The inverter of the first input stage 225 of the low section is a balanced inverter, having both p-type and n-type as large transistors. Providing other sized or configurations of transistors for the inverters may also be useful.

The outputs of the inverters of the first input stage 214 serve as first and second IM output terminals 112 and 113. For example, the output of the inverter of the high section serves as the first IM output terminal 112 and the output of the inverter of the low section serves as the second IM output terminal 113. The first IM output terminal is coupled to the second terminal of the p-type output transistor of the output inverter and the second IM output terminal is coupled to the second terminal of the n-type output transistor of the output inverter.

Providing a second input stage produces a stronger logic 1 or a stronger logic 0 signal at the redundant inverter terminal Y. The stronger logic 0 and 1 signals enable the inverter to operate at even lower operating voltages as compared to the single input stage inverter of FIG. 1b. However, the additional stage is at the cost of operating speed and larger inverter size or footprint.

In other embodiments, the input module may include other number of input stages. For example, FIGS. 1b and 2 show redundant inverters with 1 and 2 input stages. Providing 3 or more input stages for the input module may also be useful. For example, the redundant inverter may be x stage inverter of which x=n+1, where x=total number of stages of the redundant inverter,
n=the total number of input stages of the input module, and
1=the output stage of the output module.

For the n input stages, the first (n=1) is the closest input stage to the output stage and provides the IM output signals to the output module. For example, the output signals include first and second power source or rail signals for the output module. For other input stages, they provide output signals which serve as power sources for preceding input inverter stage. For example, the second input stage provides output signals which serve as power rail sources for the first input stage. Both the input and output modules receive the inverter input signal. As for the inverters of the last inverter stage (n=n), they are coupled between first and second power sources, such as $V_{DD}$ and GND.

The number of inverters in the input module is dependent on the number of input stages. In one embodiment, the number of inverters in a specific input stage is equal to $2^i$, where i is from 1 to n for an input module with n number of inverter stages and i is the $i^{th}$ input stage. As discussed, the input stage which provides the IM output signals to the output module is the lowest numbered or first input stage (e.g., i=1) while the input stage farthest away from the output module is highest numbered or last input stage (e.g., i=n). The total number of inverters in the input module is equal to the sum of inverters at each stage which is equal to the sum of $2^i$ where i=1 to n.

To illustrate, an input module with 1 input stage (i=n=1) has 2 inverters (i and n=1), resulting in a total of 2 inverters, as shown in FIG. 1b. For an input module with 2 input stages, as shown in FIG. 2, the first input stage (i=1) has 2 inverters and the second and last input stage (i=n=2) has 4 inverters, resulting in a total of 6 inverters. For an input module with 3 input stages, the first input stage (i=1) has 2 inverters, the second input stage (i=2) has 4 inverters and the third or last input stage (i=n=3) has 8 inverters, resulting in a total of 14 inverters. For an input module with 4 input stages, the first input stage (i=1) has 2 inverters, the second input stage (i=2) has 4 inverters, the third input stage (i=3) has 8 inverters and the fourth or last input stage (i=n=4) has 16 inverters, resulting in a total of 30 inverters.

Furthermore, the number of inverters for each section of the input module is divided by 2. For example, each of the high and low sections includes half of the total number of inverters. This is valid for the total number of inverters for the whole input module or for each stage of the input module. Using the examples above, a 1 input stage input module has 2 inverters, one for each section, as shown in, for example, FIG. 1b. A 2 input stage input module, which has a total of 6 inverters, has 3 inverters for each section, as shown in, for example, FIG. 2. A 3 input stage input module, which has a total of 14 inverters, has 7 inverters for each section. A 4 input stage input module which has a total of 30 inverters, has 15 inverters for each section.

As discussed, the transistors of the inverters are configured such that the high section produces a strong "1" at the output terminal Y for a logic 0 input signal at input terminal A and the low section produces a strong "0" at the output terminal Y for a logic 1 input signal at input terminal A. For example, the transistors of the inverters at the last section may be tuned to include imbalanced inverters and balanced inverters having intermediate transistors while others are configured to be balanced with large transistors. In one embodiment, the transistors of the inverters are tuned such that the high section generates a strong "1" at the first IM output terminal while the low section generates a weak "1" signal at the second IM output terminal when the input signal at input terminal A is a logic 0. On the other hand, the high section generates a weak "0" at first IM output terminal while the low section generates a strong "0" at the second IM output terminal when the input signal at input terminal A is a logic 1. When the input signal at input terminal A is a logic 1, the second terminal of the second output transistor 147 generates a strong "0" and the second terminal of the first output transistor 146 generates a weak "0". In this case, the gate voltage is 1, resulting in an nFET 168 with a smaller resistance than pFET 164, generating a strong "0" output which is more close to 147. When the input signal at input terminal A is a logic 0, the second terminal of the second output transistor 147 generates a weak "1" and the second terminal of the first output transistor 146 generates a strong "1". In this case, the gate voltage is "0", resulting in a pFET 164 with a smaller resistance than nFET 168, generating a strong "1" output which is more close to 146. Thus, a strong "1" and a strong "0" can be obtained using logic 0 and 1 as the input signals.

With each additional input stage, a stronger logic 0 or 1 output signal can be generated by the redundant inverter, enabling the inverter to operate at lower supply voltages. For example, supply voltages of less than 45 mV may be used to operate the inverter. The additional stages, however, may reduce operating speed and increase area needed.

Figure 3:
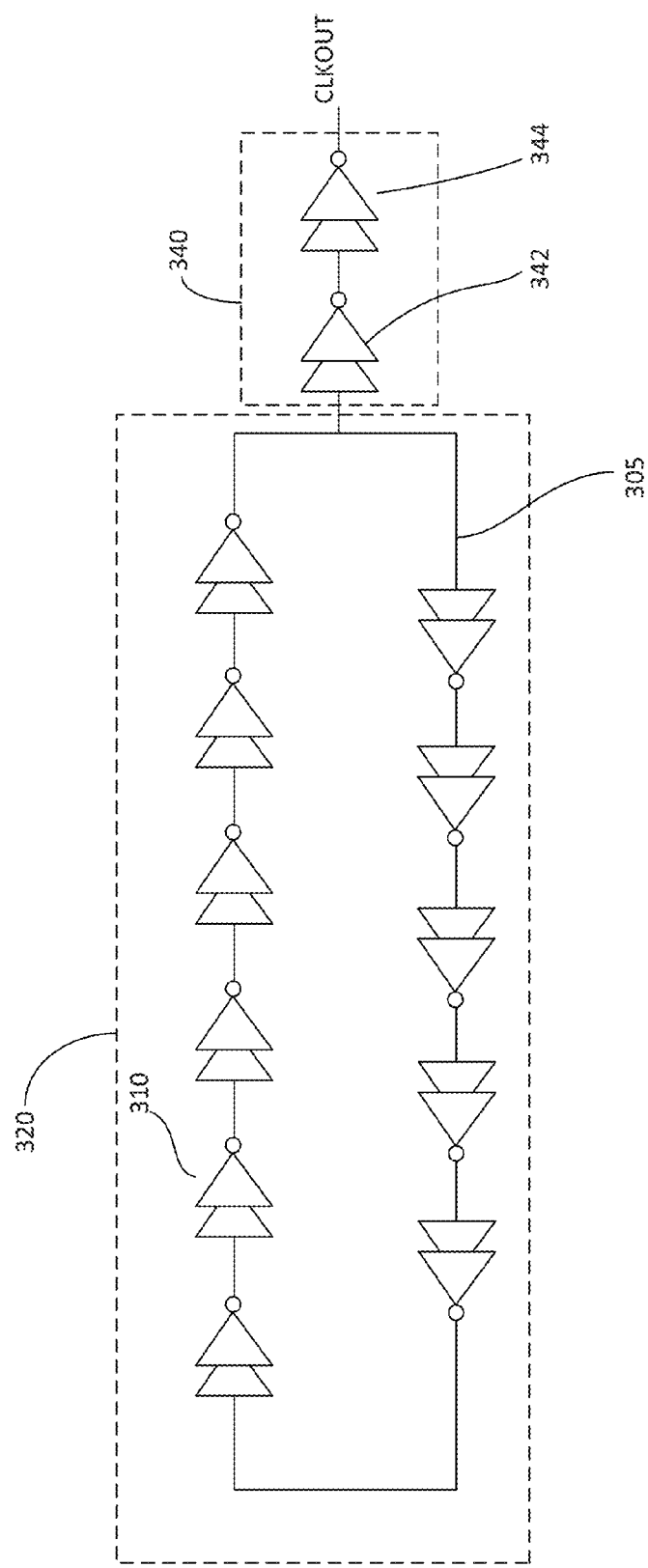
FIG. 3 shows an exemplary ring oscillator with redundant inventers.

FIG. 3 shows an exemplary embodiment of a ring oscillator 300. The ring oscillator, as shown, includes an oscillating stage/module 320 and an output stage/module 340. The ring oscillator, for example, may be used to generate a clock output (CLKOUT) signal at its output for an IC. An IC may have numerous oscillators for generating different CLKOUT signals. In one embodiment, the ring oscillator is implemented with redundant inverters 310, such as those described in FIGS. 1a-1b and FIG. 2. For example, the redundant inverter may be a 2-stage (x=2) or 3-stage (x=3)

redundant inverter. Implementing the ring oscillator with redundant inverters having other number of stages may also be useful.

The oscillating module includes an odd number of redundant inverters. As shown, the oscillating module includes 11 redundant inverters. Providing the oscillating module with other odd number of redundant inverters may also be useful. The odd number ensures switching or oscillating of the inverters. In one embodiment, the redundant inverters are configured in a ring 305. For example, the input and output of the inverters are connected in series to form a continuous ring.

The output module, in one embodiment, includes first and second output redundant inverters 342 and 344. Providing the output module with other number of inverters may also be useful. The number of inverters may depend on the desired output driving capability. For example, higher number of inverters may be used to increase drive current. The output module 340 is coupled to the oscillating module 320. For example, an input of the first output inverter is coupled to an output of an inverter of the oscillating module. Other configurations of ring oscillators may also be useful.

Figure 4A:
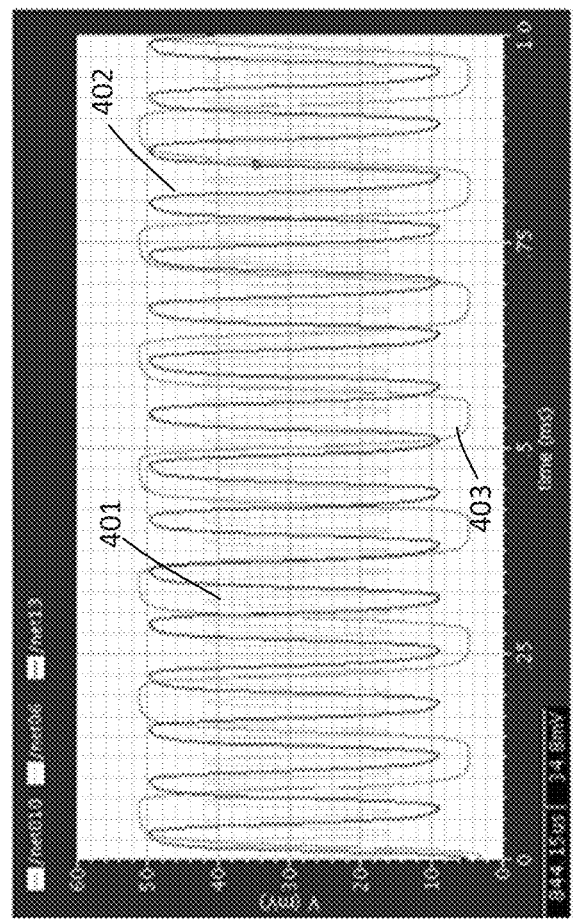
FIGS. 4a-4c show simulation results of ring oscillators with conventional inverters and multi-stage inverters as shown in FIG. 1b and FIG. 2.
Figure 4B:
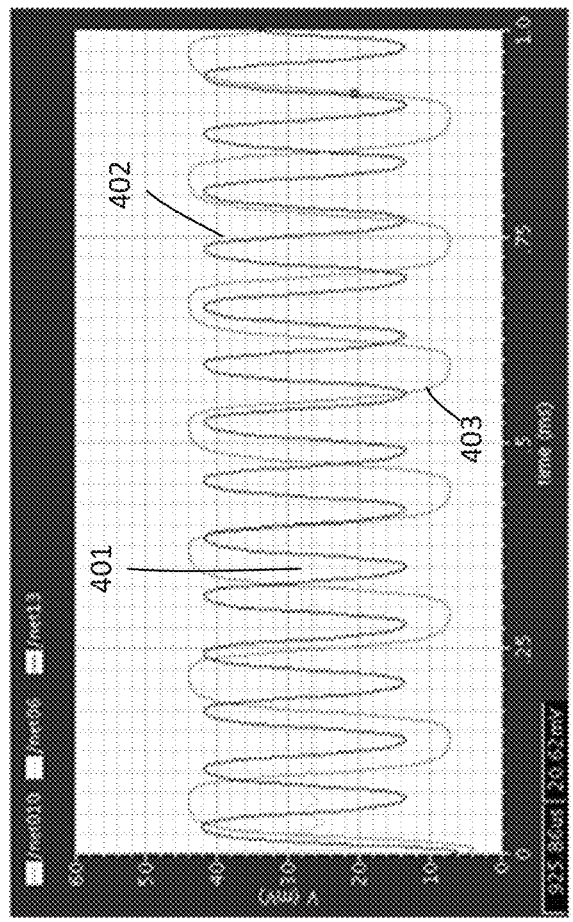
Figure 4C:
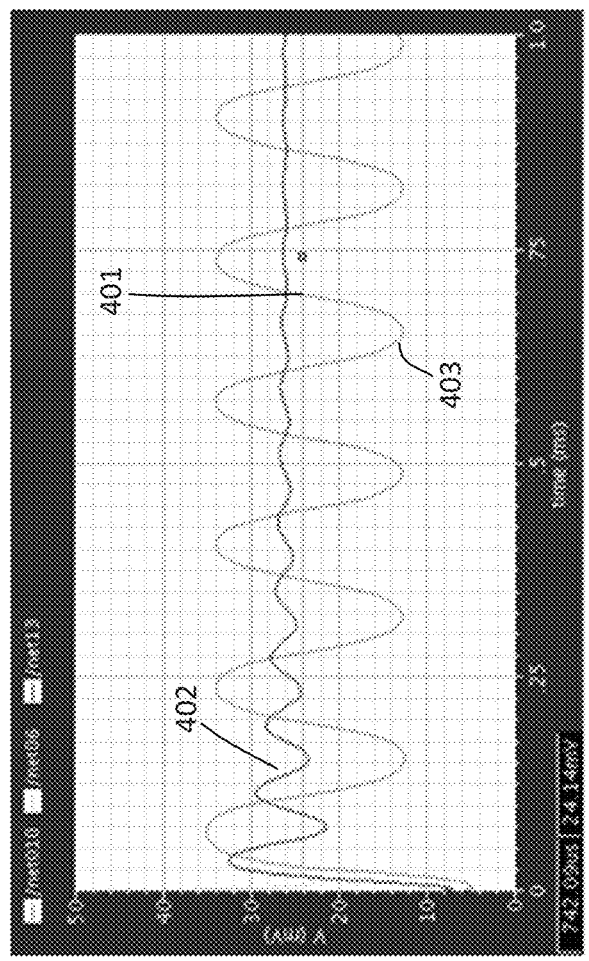

FIGS. 4a-4c show simulation results of different ring oscillators based on supply voltage. A first ring oscillator is implemented with conventional inverters, a second ring oscillator is implemented with 2-stage redundant inverters and a third ring oscillator is implemented with 3-stage redundant inverters. The first oscillator is represented by line 401, the second oscillator is represented by line 402 and the third oscillator is represented by line 403.

The simulation of the ring oscillators is based on the following parameters:

| | |
|---|---|
| Number of inverters | 11 |
| Sim Temperature | 25° |
| First Oscillator | |
| pFETs | 1 μm/60 nm |
| nFETs | 1.2 μm/60 nm |
| Second Oscillator | |
| L pFETs | 4 μm/60 nm |
| L nFETs | 4.8 μm/60 nm |
| S pFETs | 1.4 μm/60 nm |
| S nFETs | 1.6 μm/60 nm |
| Third Oscillator | |
| L pFETs | 4 μm/60 nm |
| L nFETs | 4.8 μm/60 nm |
| I pFETs | 1.5 μm/60 nm |
| I nFETs | 1.8 μm/60 nm |
| S pFETs | 0.5 μm/60 nm |
| S nFETs | 0.6 μm/60 nm |

FIG. 4a shows results of the different ring oscillators using a 55 mV supply voltage. As can be seen, all ring oscillators oscillate, producing CLKOUT signals. However, the second and third ring oscillators with the 2-stage and 3-stage redundant inverters produce the higher voltage magnitudes than the first oscillator with conventional inverters. Clearly, the third oscillator with the 3-stage inverter produces the CLKOUT signal with highest voltage magnitude.

In FIG. 4b, the supply voltage is reduced from 55 mV to 50 mV. As can be seen, the first oscillator with the conventional inverters is incapable of generating a CLKOUT signal, unlike the second and third oscillators. As shown, in FIG. 4c, when reducing the supply voltage to 45 mV, the third oscillator is still capable of generating a CLKOUT signal.

As seen from the simulations, the present redundant inverters can operate with lower supply voltages than conventional oscillators. The voltages may be further reduced by increasing the number of input stages.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A redundant inverter comprising:
   a redundant inverter input terminal for receiving an inverter input signal;
   a redundant inverter output terminal for generating an inverter output signal;
   an input module, the input module includes
      a high section which includes a first input inverter having a first p-type transistor and a first n-type transistor coupled in series between a first input inverter high power source and a first input inverter low power source, the first input inverter includes a first inverter input terminal coupled to the redundant inverter input terminal and a first inverter output terminal which serves as a high section output terminal, and
      a low section with a second input inverter having a second p-type transistor and a second n-type transistor coupled in series between a second input inverter high and low power sources, the second input inverter includes a second inverter input terminal coupled to the redundant inverter input terminal and a second inverter output terminal which serves as a low section output terminal; and
   an output module with an output inverter, the output inverter includes
      an output p-type transistor and an output n-type transistor coupled in series between the first inverter output terminal and the second inverter output terminal,
      a first output inverter terminal coupled to the redundant inverter output terminal, and
      a second output inverter terminal coupled to the redundant inverter input terminal.

2. The redundant inverter of claim 1 wherein:
   in response to a logic 1 input signal at the redundant inverter input terminal,
      the first input inverter of the high section is configured to generate a weak "0" at the high section output terminal, and
      the second input inverter of the low section is configured to generate a strong "0" at the low section output terminal; and
   in response to a logic 0 input signal at the redundant inverter input terminal,
      the first inverter of the high section is configured to generate a strong "1" at the high section output terminal, and
      the second inverter of the low section is configured to generate a weak "1" at the low section output terminal.

3. The redundant inverter of claim 2 wherein:
the redundant inverter output terminal comprises a strong "1" in response to a logic 0 input signal at the redundant inverter input terminal; and
the redundant inverter output terminal comprises a strong "0" in response to a logic 1 input signal at the redundant inverter input terminal.

4. The redundant inverter of claim 1 wherein:
the input module comprises a single input stage; and
the input module and the output module form a 2-stage redundant inverter.

5. The redundant inverter of claim 1 wherein:
the first and second input inverters form a single stage input module;
the first and second high power sources comprise device high power sources;
the first and second low power sources comprise device low power sources, and
the single stage input module and output module form a 2-stage redundant inverter.

6. The redundant inverter of claim 5 wherein:
in response to a logic 1 input signal at the redundant inverter input terminal,
  the first input inverter of the high section is configured to generate a weak "0" at the high section output terminal, and
  the second input inverter of the low section is configured to generate a strong "0" at the low section output terminal; and
in response to a logic 0 input signal at the redundant inverter input terminal,
  the first inverter of the high section is configured to generate a strong "1" at the high section output terminal, and
  the second inverter of the low section is configured to generate a weak "1" at the low section output terminal.

7. The redundant inverter of claim 6 wherein:
the first p-type transistor of the first input inverter is a large pFET;
the first n-type transistor of the first input inverter is a small nFET;
the second p-type transistor of the second input inverter is a small pFET; and
the second n-type transistor of the second input inverter is a large nFET.

8. The redundant inverter of claim 1 is incorporated in a ring oscillator circuit comprising a plurality of redundant inverters connected in series, wherein a last of the redundant inverter is series connected to a first of the redundant inverter to form a ring.

9. The redundant inverter of claim 1 wherein the input module comprises first and second input stages to form a 3-stage redundant inverter, wherein:
the first input stage comprises the first and second input inverters;
the second stage comprises
  third and fourth input inverters for the high section of the input module, wherein
    the third input inverter includes a third p-type transistor and a third n-type transistor coupled in series between device high and low power sources, an input terminal of the third inverter is coupled to the redundant inverter input terminal, and an output terminal of the third inverter is coupled to the first input inverter high power source,
    the fourth input inverter includes a fourth p-type transistor and a fourth n-type transistor coupled in series between device high and low power sources, an input terminal of the fourth inverter is coupled to the redundant inverter input terminal and an output terminal of the fourth inverter is coupled to the first input inverter low power source, and
  fifth and sixth input inverters for the low section of the input module, wherein
    the fifth input inverter includes a fifth p-type transistor and a fifth n-type transistor coupled in series between device high and low power sources, an input terminal of the fifth inverter is coupled to the redundant inverter input terminal, and an output terminal of the fifth inverter is coupled to the second input inverter high power source, and
    the sixth input inverter includes a sixth p-type transistor and a sixth n-type transistor coupled in series between device high and low power sources, an input terminal of the sixth inverter is coupled to the redundant inverter input terminal, an output terminal of the sixth inverter is coupled to the second input inverter low power source.

10. The redundant inverter of claim 9 wherein:
in response to a logic 1 input signal at the redundant inverter input terminal,
  the high section of the input module is configured to generate a weak "0" at the high section output terminal, and
  the low section of the input module is configured to generate a strong "0" at the low section output terminal; and
in response to a logic 0 input signal at the redundant inverter input terminal,
  the high section of the input module is configured to generate a strong "1" at the high section output terminal, and
  the low section of the input module is configured to generate a weak "1" at the low section output terminal.

11. The redundant inverter of claim 9 wherein:
the first and second input inverters comprise balanced first and second input inverters with large FETs;
the third inverter comprises an imbalanced third inverter with a large pFET and small nFET;
the fourth and fifth input inverters comprise balanced fourth and fifth input inverters with intermediate FETs; and
the sixth inverter comprises an imbalanced sixth inverter with a small pFET and a large nFET.

12. The redundant inverter of claim 11 wherein:
in response to a logic 1 input signal at the redundant inverter input terminal,
  the high section of the input module is configured to generate a weak "0" at the high section output terminal, and
  the low section of the input module is configured to generate a strong "0" at the low section output terminal; and
in response to a logic 0 input signal at the redundant inverter input terminal,
  the high section of the input module is configured to generate a strong "1" at the high section output terminal, and the low section of the input module is configured to generate a weak "1" at the low section output terminal.

13. The redundant inverter of claim 12 wherein the output inverter comprises balanced output inverters with large FETs.

14. The redundant inverter of claim 13 wherein:
the redundant inverter output terminal comprises a strong "1" in response to a logic 0 at the redundant inverter input terminal; and
the redundant inverter output terminal comprises a strong "0" in response to a logic 1 at the redundant inverter input terminal.

15. The redundant inverter of claim 14 is incorporated in a ring oscillator circuit comprising a plurality of redundant inverters connected in series, wherein a last of the redundant inverter is series connected to a first of the redundant inverter to form a ring.

16. A redundant inverter comprising:
a redundant inverter input terminal for receiving an inverter input signal;
a redundant inverter output terminal for generating an inverter output signal;
an input module, the input module includes inverters arranged into
a high section generating a high section output signal at a high section output terminal,
a low section generating a low section output signal at a low section output terminal, and
wherein
in response to a logic 1 input signal at the redundant inverter input terminal,
the high section is configured to generate a weak "0" at the high section output terminal, and
the low section is configured to generate a strong "0" at the low section output terminal, and
in response to a logic 0 input signal at the redundant inverter input terminal,
the high section is configured to generate a strong "1" at the high section output terminal, and
the low section is configured to generate a weak "1" at the low section output terminal;
an output module with an output inverter, the output inverter includes
an output inverter high power source terminal coupled to the high section output terminal,
an output inverter low power source terminal coupled to the low section output terminal,
an output inverter input terminal coupled to the redundant inverter input terminal, and
an output inverter output terminal coupled to the redundant inverter output terminal.

17. The redundant inverter of claim 16 wherein the input module comprises n stages to form an n+1 stage redundant inverter, the input module comprises a sum of $2^i$ transistors where i is from 1 to n and an $i^{th}$ stage comprises $2^i$ transistors.

18. The redundant inverter of claim 17 wherein:
an output of a first transistor of the first input stage (i=1) is the high section output terminal;
an output of a second transistor of the first input stage is the low section output terminal;
inverters of the last input stage (i=n) have transistors coupled between device high and low power sources; and
output terminals of inverters of stages from 2 to n serve as power sources for inverters of a preceding stage (i=i−1).

19. The redundant inverter of claim 16 is incorporated in a ring oscillator circuit comprising a plurality of redundant inverters connected in series, wherein a last of the redundant inverter is series connected to a first of the redundant inverter to form a ring.

20. A ring oscillator circuit comprising a ring oscillator module having a plurality of redundant inverters connected in series to form a ring configuration, wherein a last of the redundant inverter is series connected to a first of the redundant inverter to form a ring, wherein each redundant inverter comprises:
a redundant inverter input terminal for receiving an inverter input signal;
a redundant inverter output terminal for generating an inverter output signal;
an input module, the input module includes inverters arranged into
a high section generating a high section output signal at a high section output terminal,
a low section generating a low section output signal at a low section output terminal, and
wherein
in response to a logic 1 input signal at the redundant inverter input terminal,
the high section is configured to generate a weak "0" at the high section output terminal, and
the low section is configured to generate a strong "0" at the low section output terminal, and
in response to a logic 0 input signal at the redundant inverter input terminal,
the high section is configured to generate a strong "1" at the high section output terminal, and
the low section is configured to generate a weak "1" at the low section output terminal;
an output module with an output inverter, the output inverter includes
an output inverter high power source terminal coupled to the high section output terminal,
an output inverter low power source terminal coupled to the low section output terminal,
an output inverter input terminal coupled to the redundant inverter input terminal, and
an output inverter output terminal coupled to the redundant inverter output terminal.

* * * * *